United States Patent
Schmitz et al.

(10) Patent No.: US 6,656,760 B2
(45) Date of Patent: Dec. 2, 2003

(54) SOLID STATE IMAGING SENSOR IN A SUBMICRON TECHNOLOGY AND METHOD OF MANUFACTURING AND USE OF A SOLID STATE IMAGING SENSOR

(75) Inventors: Jurriaan Schmitz, Eindhoven (NL); Edwin Roks, Eindhoven (NL); Daniel Wilhelmus Elisabeth Verbugt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 09/803,336

(22) Filed: Mar. 9, 2001

(65) Prior Publication Data

US 2001/0055832 A1 Dec. 27, 2001

(30) Foreign Application Priority Data

Mar. 9, 2000 (EP) ............................................. 00200838

(51) Int. Cl.$^7$ ........................ H01L 21/00; H01L 29/82; H01L 43/00
(52) U.S. Cl. ........................................ 438/57; 257/427
(58) Field of Search ............................. 438/57, 59–60, 438/66–67; 257/428, 431, 432, 440, 443, 446

(56) References Cited

U.S. PATENT DOCUMENTS

| | | | |
|---|---|---|---|
| 5,796,154 A | 8/1998 | Sano et al. | 257/432 |
| 5,859,450 A | 1/1999 | Clark et al. | 257/233 |
| 5,871,888 A | 2/1999 | Heremans et al. | 430/321 |
| 6,001,540 A | 12/1999 | Huang et al. | 430/321 |
| 6,026,964 A | 2/2000 | Hook et al. | 207/292 |
| 6,171,885 B1 * | 1/2001 | Fan et al. | 438/70 |

FOREIGN PATENT DOCUMENTS

| | | |
|---|---|---|
| EP | 0883187 A1 | 12/1998 |
| EP | 0917206 A1 | 5/1999 |
| WO | 9319489 A1 | 9/1993 |
| WO | 9849729 A1 | 11/1998 |
| WO | 9857369 A1 | 12/1998 |
| WO | 9948152 A1 | 9/1999 |

* cited by examiner

Primary Examiner—Craig Thompson
(74) Attorney, Agent, or Firm—Steven R. Biren

(57) ABSTRACT

A detector and a camera system for electromagnetic radiation being integrated in a solid state substrate are disclosed. Said substrate comprises a first region of a first conductivity and a second region of a second conductivity, said first region being adjacent to said second region, and said first and second region forming a detection junction, at least part of said junction being substantially orthogonal with respect to the plane of the surface of the substrate above said detection junction. The camera system comprises a configuration of pixels in an imaging sensor being integrated in a solid state substrate, essentially each of the pixels comprising a region of a first conductivity type being at least partly surrounded by a region of a second conductivity type, thereby forming a junction region, and wherein the region of the first conductivity type includes at least one contact area. The camera system further comprises means for collecting charge carriers being generated by the radiation impinging on said substrate at least in said region of said first conductivity type and in said junction region, in said contact area.

10 Claims, 5 Drawing Sheets

SOLID STATE IMAGING SENSOR IN A SUBMICRON TECHNOLOGY AND METHOD OF MANUFACTURING AND USE OF A SOLID STATE IMAGING SENSOR

FIELD OF THE INVENTION

The present invention is related to the field of solid state imaging devices and to a method of manufacturing and operating of such devices. More in particular a solid state imaging device manufacturable in a Metal-Oxide-Semiconductor (MOS) or in a Complementary Metal-Oxide-Semiconductor (CMOS) technology is disclosed.

BACKGROUND OF THE INVENTION

Solid state imaging sensors are known in the art. Commonly solid state imaging sensors are implemented in a CCD-technology or in a CMOS- or MOS-technology. Solid state imaging sensors find a widespread use in camera systems. In this embodiment a matrix of pixels comprising light sensitive elements constitutes an imaging sensor, which is mounting in the camera system. The signal of said matrix is measured and multiplexed to a so-called video-signal.

Solid state imaging sensor based camera systems in general dominate electronic imaging applications such as Closed Circuit Television (CCTV), video cameras and camcorders, scanners and newly developed markets such as PC (Personal Computer)-cameras, PDA's, cell phones and DSC, and cameras for video conferencing and Digital Still Cameras. Yet another application of solid state imaging sensors in camera systems is the use in digital photography camera systems wherein the actual image is taken within the solid state sensor instead of on a film material. One popular form of solid state image sensor is the Charge Coupled Device (CCD) image sensor, while sensors built entirely in standard CMOS technology are also becoming used. Such CCD and CMOS image sensors commonly comprise an array of pixels formed in a semiconductor substrate, each pixel comprising a photosensitive element which is normally in the form of a photodiode, or alternatively a polysilicon electrode (photogate), for responding to incident light.

CCD-based camera systems have less noise fluctuations in the image compared to CMOS- or MOS-based camera systems. Therefore CCD-based camera systems are nowadays preferred in applications wherein a high image quality is required such as video or still camera applications. There is an ongoing effort in the art to improve the image quality of CMOS-based camera systems. Due to the further miniaturization of the CMOS electronics technology, it is furthermore possible to realize complex CMOS- or MOS-based pixels as small as CCD-based pixels. It is a further advantage of CMOs- or MOS-based pixels that CMOS is a technology being offered by most foundries whereas CCD-technology is rarely offered and a more complex and expensive one. Of the image sensors implemented in a CMOS- or MOS-technology, CMOS or MOS image sensors with passive pixels and CMOS or MOS image sensors with active pixels are distinguished. An active pixel is configured with means integrated in the pixel to amplify the charge that is collected on the light sensitive element. Passive pixels do not have said means and require a charge-sensitive amplifier that is not integrated in the pixel and is connected with a long line towards the pixel. For this reason, active pixel image sensors are potentially less sensitive to noise fluctuations than passive pixels. Due to the additional electronics in the active pixel, an active pixel image sensor may be equipped to execute more sophisticated functions, which can be advantageous for the performance of the camera system. Said functions can include filtering, operation at higher speed or operation in more extreme illumination conditions.

The manufacturing of CMOS based active pixel sensors (APS) has several more advantages. The APS sensors can easily be miniaturized. This is because the camera system basically can be a single chip and a lens, with the single chip containing signal processing functionality. The possibility that is offered for miniaturizing the whole camera system is important e.g. for portable applications such as cell phones or portable PC's. Due to the increased integration of functionality on one chip, also the power consumption of the APS chip can be reduced. Furthermore, the integration of signal processing functions on chip allows for the implementation of specific features such as random access to each pixel of the sensor, and readout of small windows of interest for applications such as machine vision or tracking, and electronic pan and zoom for consumer applications.

As stated above, CMOS image sensors with active pixels include in each pixel at least a photosensitive element and at least one MOS amplifying transistor. A common pixel type is the so-called 3T-pixel that includes a photosensitive element, a reset transistor in series with the photosensitive element and an amplifying transistor connected to the photosensitive element and the reset transistor (see e.g. O. Yadid-Pecht, IEEE Trans. Electr. Dev. 38(8), 1772 (1991)). In some applications, the reset transistor is configured so as to define a 3T-transistor with a logarithmic characteristic (see e.g. M. A. mahowald, SPIE Proceedings Vol. 1473, 52 (1991)).

The imaging process in solid state imaging devices is initiated by radiation impinging on the solid state substrate. In a silicon substrate the impinging electromagnetic radiation such as light creates charge carriers (electron-hole pairs) that are to be collected and further processed in the amplifying electronics in the periphery of the matrix of pixels and/or in the amplifying electronics integrated in the pixel or the matrix of pixels. Commonly the impinging light is detected in photosensitive elements wherein a p-n or n-p or a $n^+$-p or $p^+$-n or any such junction, in the sequel labeled as p-n junction, is present. Thus the photosensitive element can also be a transistor such as a bipolar transistor, or the photosensitive element can also be part of a transistor such as an unsilicided drain/source area of a MOS transistor. The photosensitive element can also be a photogate such as a one-cell charge coupled device (CCD) line or even an IR type of sensor. The p-n junction commonly is in reverse bias, thus with an enhanced depletion layer. The p-n junctions are commonly located at the surface of the solid state substrate wherein the matrix of pixels is integrated. Examples of the geometry of such devices is shown in FIG. 2 of the patent application WO93/19489 and in FIGS. 3–11 of the patent application WO98/49729. A common geometry is schematically shown in FIG. 1 of the present patent application. Shown in FIG. 1 is the cross section of part of a solid state imaging device as commonly implemented in a MOS-technology. The photosensitive element is formed by a $n^+$-p junction ($n^+$-region (11) on p-region (12)) of which the depletion region (13) can be enhanced through the application of an appropriate voltage. The p-region can be a p-well in a substrate or can be the p-type substrate itself. The different photosensitive elements are separated by field isolation regions (LOCOS regions made of oxide material (14)). Also a whole pixel configuration, i.e. the associated amplifying and/or access transistors, can be integrated with the photosensitive elements in the regions in-between the isolation regions.

For the majority of applications of solid state imaging devices, the achievement of a high efficiency in the conversion of the impinging radiation is an important aim and an important design criterion. In particular, for CMOS based imaging devices it is advantageous that this aim is realized without changing significantly the MOS process flow as such non-standard processing would lead to an important price increase of the imaging devices.

Patent application EP883187 discloses a CMOS based imaging device having a high efficiency in the conversion of the impinging radiation. The concept as disclosed in EP883187 however is suitable only for larger gate length devices, namely CMOS based imaging devices implemented in a 1.2 or 0.7 or 0.5 or 0.35 $\mu$m CMOS technology. The concept furthermore requests some changes to a standard CMOS process flow. The concept of EP883187 still shows an imperfection in the Modulation Transfer Function of the order of 10% for the larger pixel sizes (>7,5×7,5 $\mu$m) which in a number of applications with smaller pixel sizes such as consumer applications (5,6×5,6 $\mu$m) will lead not be acceptable.

In general, in smaller gate length devices the depletion layers of the photosensitive elements are also decreasing, especially as the necessary doping densities of the different regions in smaller gate length devices increase. As a result the conversion efficiency of such smaller gate length CMOS based imaging devices decreases and therefore an important design criterion cannot be met. Moreover the junction leakage current increases over at least an order of magnitude and the junction capacitance increases over several factors.

Another problem in the art is associated with the penetration depth of the impinging radiation. In the prior art detection geometry's as shown in FIG. 1, the charge carriers that are created deeper in the substrate by for example light photons that penetrate deeper in the solid state substrate, are not collected. This phenomenon leads to a decrease of the conversion efficiency of CMOS based imaging devices. The solution for this problem as disclosed in the patent application EP883187, is hampered by the fact that the charge carriers created in the surface regions of the solid state substrate, outside of the p-n junctions of the photosensitive elements are not collected.

Yet another problem in the art is the presence of damage and dangling bonds at the surface of a solid state substrate. The presence of such surface states in the p-n junctions of the photosensitive elements can create a charge layer and a leakage current that negatively impact the performance of the solid state imaging sensor and therefore of the imaging device.

SUMMARY OF THE INVENTION

An aim of the present invention is to disclose a solid state imaging device, such as a detector or a sensor or a camera system, with a high efficiency in the conversion of the impinging radiation. Another aim of the present invention is to disclose a solid state imaging device, such as a detector or a sensor or a camera system that is manufacturable without significantly changing a standard production process to thereby make solid state imaging devices at a reasonable cost. Several aspects of the invention are summarized herebelow. The different aspects and embodiments of the invention that are explained in this section and throughout this specification can be combined. Each of the aspects or embodiments of the invention solves at least one of the problems in the prior art, mentioned hereabove. A number of terms that is used in this summary and throughout the specification is explained at the end of this section.

In a first aspect of the present invention a detector for electromagnetic radiation is disclosed. The detector can be part of an integrated circuit in a solid state (silicon) substrate. The detector can also be at least partly integrated in a solid state substrate, said substrate comprising a first region of a first conductivity and a second region of a second conductivity, said first region being adjacent to said second region, and said first and second region forming a detection junction, at least part of said detection junction being substantially orthogonal with respect to the plane of the surface of the substrate above said detection junction. At least part of said first region and the detection junction can be covered with a passivating layer, optionally defining a smooth interface with the first region. The passivating layer can be an insulating material or a semiconducting material. In a preferred embodiment, the passivating layer is an oxide layer. In these embodiments, the first region and the second region are located in the surface layers of the substrate. The second region may also be covered by the same or another passivating layer. In an embodiment of the invention, said passivating layer can be interrupted with at least one elevated portion of the substrate material, a contact area optionally being within the elevated portion. The region of the second conductivity type can surround the region of the first conductivity type entirely along its sides. According to an embodiment of this first aspect of the invention, use can be made of a first region of n-type conductivity, preferably of a doping level of charge carriers of the order of $10^{15}$–$10^{16}$–$10^{17}$/cm$^3$, and of a second region of p-type conductivity, preferably of a doping level of charge carriers of the order of $10^{15}$–$10^{16}$–$10^{17}$/cm$^3$ for making a detector for electromagnetic radiation. The doping levels may also be lower, of the order of $5.10^{14}$/cm$^3$, or higher, of the order of $5.10^{17}$–$10^{18}$/cm$^3$. The first and the second region according to this embodiment can have a depth of about 0.3 to 0.5 to 1 $\mu$m. Also only the first region can have this depth, the second region being part of the substrate or having the same doping type but a different doping level than the substrate.

The detector may be used as part of a camera system for electronic imaging applications such as cameras and video cameras and camcorders, camera systems for video conferencing, or for digital photography or within medical or industrial imaging systems. The detector may also be part of a camera system in an environment having a memory function such as a PC or a mobile phone or any of the cameras mentioned in the introduction section. In the camera system, the charge carriers that are created by radiation impinging upon the detector, or at least the radiation impinging upon the first region and on the junction in-between the first and the second region, can be collected in the contact area and be transferred to the amplifying and image-processing electronics through metallization of the contact area. In an embodiment of the invention, a voltage can be applied to the contact area in the first region in order to collect charge carriers in this first region while the second region, preferably surrounding said first region, is grounded. At least part of the camera system can be integrated in an integrated circuit (chip), for example in a silicon substrate. In such embodiment the camera system basically can be a single chip and a lens, for example a microlens, with the single chip containing a detector for electromagnetic radiation and signal processing functionality, and a memory for storing the acquired images.

In a second aspect of the present invention, a camera system is disclosed for electromagnetic radiation. Said camera system comprises a configuration or a matrix of pixels in an imaging sensor being integrated in a solid state substrate, essentially each of the pixels including a region of a first conductivity type being at least partly surrounded by a region of a second conductivity type, thereby forming a junction region, the region of the first conductivity type including at least one contact area.

The camera system can further comprise means for collecting charge carriers being generated by the radiation impinging on said substrate at least in said region of said first conductivity type and in said junction region, in said contact area. Hereto, in an embodiment of this second aspect of the invention, a voltage can be applied to the contact area in the first region in order to collect charge carriers in this first region while the second region, preferably surrounding said first region and being shared among adjacent pixels, is grounded.

The camera system can also comprise at least one operation transistor being integrated in an area portion of the region of said second conductivity type. In this way a pixel configuration can be made by connecting the contact area of the first region to the transistor or the set of transistors in the second region. Transistors can also be defined in the region of the first conductivity type. The detection junction of pixels of the sensor of the camera system can be substantially orthogonal with respect to the plane of the surface of the substrate above said detection junction and the region of the second conductivity type can be surrounding the region of the first conductivity type substantially entirely along its sides for one pixel or for all of the pixels.

The camera system can further have a passivating layer on the region of the first conductivity type in either one, or more or all of the pixels, the passivating layer optionally defining a smooth interface with the region of the first conductivity type. The passivating layer may also be present on the region of the second conductivity type. The passivating layer can contain an insulator material and the contact area in the region of the first conductivity part can be on an elevated part of the substrate, said elevated part interrupting said layer containing the insulator material.

The radiation that is impinging on the camera system can be directed to the different pixels through a microlens system that preferably is directing the radiation impinging on said imaging sensor into said region of said first conductivity type and in said Junction region. The camera system can also comprise a filter being sensitive for a characteristic of the impinging radiation, such as the color of the light impinging on the camera system. In an embodiment of the invention, the camera system or part of it can be integrated with the matrix of pixels in a silicon substrate according to a 1.2 or 0.7 or 0.5 or 0.35 or 0.25 or 0.18 mm or a smaller gate length CMOS process. The CMOS process can include a shallow-trench isolation (STI)-option. In this way the camera system basically can be a single silicon chip and a lens, with the single chip containing signal processing functionality. The possibility that is offered for miniaturizing the whole camera system is important e.g. for portable applications such as cell phones or portable PC's. Due to the integration of functionality and sensor on one chip, the power consumption of the camera system can be reduced. Furthermore, the integration of signal processing functions on chip allows for the implementation of specific features such as random access to each pixel of the sensor, and readout of small windows of interest for applications such as machine vision or tracking, and electronic pan and zoom for consumer applications.

The camera system for electronic imaging applications can be a camera or a video camera or a camcorder, or a camera system for video conferencing, or a camera system for digital photography or for medical or industrial imaging applications. The camera may also be integrated in an environment having a memory function such as a PC or a mobile phone or any of the cameras mentioned in the introduction section.

In a third aspect of the present invention, a method is disclosed for fabricating a camera system for electromagnetic radiation, said camera system comprising a configuration of pixels in an imaging sensor being integrated in a solid state substrate of a second conductivity type. The method comprises the steps of:

defining a region of a first conductivity type in said substrate defining a region of a second conductivity type, adjacent to said region of said first conductivity type in said substrate, thereby forming a junction region;

etching at least part of the substrate of the region of the first conductivity type to thereby form a trench in said substrate;

filling the etched trench with a passivating material; and optionally providing means for contacting the region of the first conductivity type and means for collecting charge carriers being generated by the radiation impinging on said substrate at least in said region of said first conductivity type and in said junction region, in said means for contacting the region of the first conductivity type.

In a fourth aspect of the present invention, a method of operating a camera system for electromagnetic radiation is disclosed, said camera system comprising a configuration of pixels in an imaging sensor being integrated in a solid state substrate, essentially each of the pixels comprising a region of a first conductivity type being at least partly surrounded by a region of a second conductivity type, thereby forming a junction region, and wherein the region of the first conductivity type includes at least one contact area. The method comprises the step of configuring the region of the first conductivity type and the region of the second conductivity type as to collect charge carriers being generated by the radiation impinging on said substrate at least in said region of said first conductivity type and in said junction region, in said contact area.

A number of terms that is used in this summary and throughout the specification is explained herebelow. With the terms adjacent, for example adjacent regions, it is meant that the regions can be adjacent while still being separate one form another, and that the regions can be adjacent and abutting one to another. An operation transistor can be any transistor that forms part of a sensor or a camera system, such as an access transistor or an amplifying transistor of a pixel. An environment with memory functionality for example can be a PC or any computer or our ASIC with memory functionality or a digital photography or imaging sensor.

DETAILED DESCRIPTION OF THE INVENTION

For the purpose of teaching of the invention, preferred embodiments of the method and devices of the invention are described in the sequel. In particular embodiments of the invention for MOS based imaging devices and manufacturable in a 0.18 µm CMOS or smaller gate length technology are disclosed. It will be apparent to the person skilled in the art that other alternative and equivalent embodiments of the invention can be conceived and reduced to practice without departing form the true spirit of the invention, the scope of the invention being limited only by the appended claims.

One of the aims of the present invention is to disclose a solid state imaging device with a high efficiency in the conversion of the impinging radiation. In particular, it is shown in an embodiment of the invention for CMOS based imaging devices that this aim is realized without changing significantly the CMOS process flow.

The sensitivity for impinging radiation is explained herebelow for the embodiments of CMOS based vision sensor imaging devices. The sensitivity of a sensor for UV, IR and visible light can be expressed as the probability that an impinging photon is creating a signal, an electrical signal, within the sensor. This probability is labeled the efficiency η which can be expressed as a product of efficiencies $$\eta = \eta_{geom} * \eta_{trans} * \eta_{coll}$$

Figure 1:
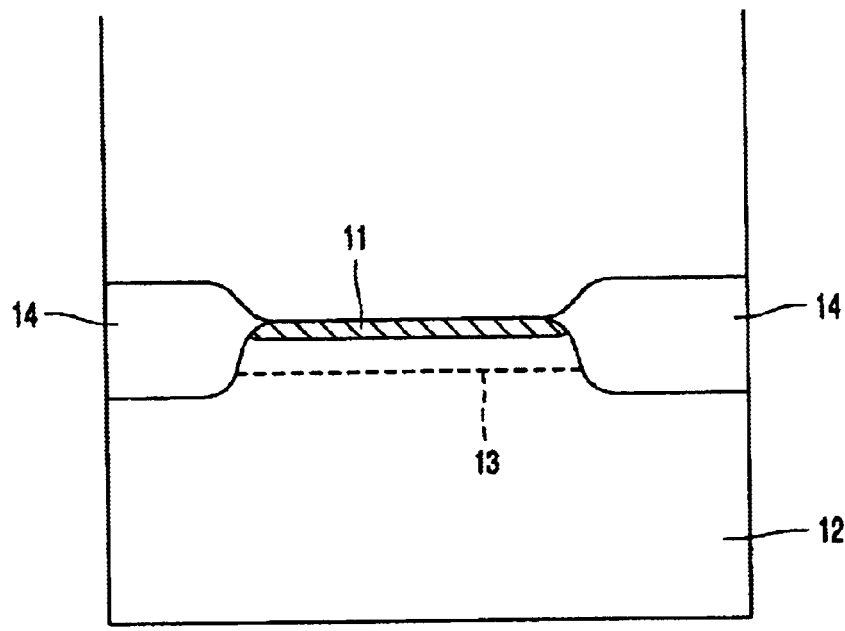
FIG. 1 shows a schematic cross section of part of a prior art solid state imaging device as commonly implemented in a MOS-technology. The photosensitive element of a pixel of the solid state imaging device is formed by a $n^+$-p junction ($n^+$-region (11) on p-region (12)) of which the depletion region (13) can be enhanced through the application of an appropriate v voltage.

The different terms have a different origin. $\eta_{geom}$ is also known as the 'fill factor' of a sensor, which is related to the presence of area's ('dead area's') on the sensor which are not sensitive to the impinging light. In prior art sensors, an example of such area's are the field isolation regions, the LOCOS regions (14 in FIG. 1) made of oxide material. Also the associated amplifying and/or access transistors that are integrated with the photosensitive elements in the regions in-between the isolation regions are 'dead area's'. $\eta_{trans}$ is related to the partial reflection and/or absorption of light at the surface of the sensor. For example, the area of a silicon surface that is silicided is reflecting all of the impinging radiation. Thus $\eta_{trans}$ is equal to zero for these area's. In order to avoid this problem of silicided area's in CMOS based vision sensors, extra mask sets and process steps can be introduced in the CMOS process flow. This however leads to an increase of the process complexity and increases the cost of such CMOS vision sensors. The last term $\eta_{coll}$ in the definition of the efficiency η of a CMOS vision sensor is related to the efficient collection of charge carriers that are created by the impinging light. The charge carriers, the electron-hole pairs, that are created by the impinging light, should be efficiently collected in order to contribute to the electrical signal of the sensor. The loss of sensitivity as a result of this factor can be minimized by using a substrate of a high crystalline quality, and therefore having a low recombination velocity and a high diffusion length for the charge carriers. The loss of sensitivity a result of this factor can also be minimized by increasing the depletion regions of the p-n junctions of the photosensitive elements of the vision sensors.

As a general rule in designing vision sensors, it is furthermore advantageous that the optical path of the impinging light is free of impedances. Hereto the metallization of the vision sensor has to fulfill the requirement that most of the impinging light can pass to the photosensitive elements which include i.a. that the thickness and the refractive index of the layers that are part of the metallization are to fulfill specific specs.

Another boundary condition in the design of vision sensors in CMOS processes is that with the down-shrinking of the transistor dimensions, the doping levels of the p- and n-regions increase whereby the depletion layers will decrease. As a result the sensitivity and conversion efficiency of vision sensors decreases.

In the present specification, there is disclosed a detector for electromagnetic radiation being integrated in a solid state substrate, said substrate comprising a first region of a first conductivity and a second region of a second conductivity, said first region being adjacent to said second region, and said first and second region forming a detection junction, at least part of said detection junction being substantially orthogonal with respect to the plane of the surface of the substrate above said detection junction. The detector can be part of a camera system for electromagnetic radiation, said camera system comprising a configuration of pixels in an imaging sensor being integrated in the solid state substrate, essentially each of the pixels comprising a detector as described hereabove. Each of the pixels can also have the feature of the region of the first conductivity type being at least partly surrounded by the region of the second conductivity type, thereby forming a junction region; the region of the first conductivity type including at least one contact area; and means for collecting charge carriers being generated by the radiation impinging on said substrate at least in said region of said first conductivity type and in said junction region, in said contact area. At least one operation transistor can be integrated in an area portion on the region of said second conductivity type or in the region of the first conductivity type.

Figure 2:
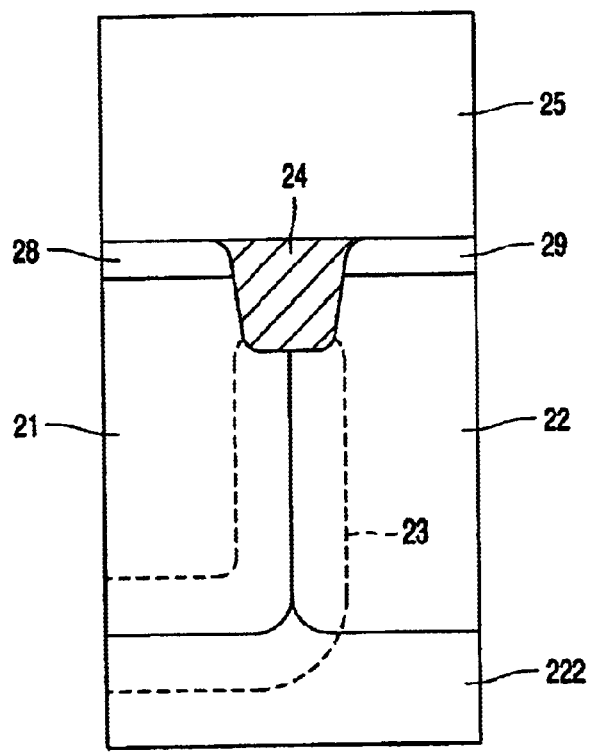
FIG. 2 shows schematically part of the design of a vision sensor of the invention according to an embodiment in a CMOS 0.18 µm technology. Shown is part of a detector for electromagnetic radiation being integrated in a silicon solid state substrate (222). In the silicon substrate that is of a p⁻ doping level (222), a n-well region (21) is defined. A p-well region (22) is also defined that is adjacent to and abutting the n-well region (21). At the junction between the n-well region (21) and the p-well region (22) and/or the p-substrate (222), there is a depletion region (23). An insulating (oxide) region (24) that is transparent for light is above the junction in a trench in the surface of the substrate. The n-well and the p-well regions are at least partly covered by an n⁺-(28), resp. p⁺-area (29) and/or an oxide area, wherein transistors and contact area's can be defined.

FIG. 2 shows schematically part of the design of a vision sensor of the invention according to an embodiment in a CMOS 0.18 µm technology. Shown is part of a detector for electromagnetic radiation being integrated in a silicon solid state substrate (222). This detector can be part of a vision sensor of a camera system. In the silicon substrate that is of a p⁻ doping level (222), a n-well region (21) is defined. A p-well region (22) is also defined that is adjacent to and abutting the n-well region (21). The p-well region can also be adjacent to the n-well region but not touching and separate from the n-well region. The p-well region can also be omitted, only the junction between the n-well (21) and the p-substrate (222) remaining. At the junction between the n-well region (21) and the p-well region (22) and/or the p-substrate (222), there is a depletion region (23). An insulating (oxide) region (24) that is transparent for light is above the junction in a trench in the surface of the substrate. It is shown in FIG. 2 that the junction between the n-well region (21) and the p-well region (22) is substantially orthogonal with respect to the plane of the surface of the substrate above the detection junction. The n-well and the p-well regions contain at least partly covered by an $n^+$-(28), resp. $p^+$-area (29) and/or an oxide area, wherein transistors and contact area's can be defined. If the p-well region is biased to ground and a contact area is defined within the $n^+$-area, with an appropriate voltage thereon (for example in the range of 1–5 Volt), the charge carriers that are generated by the radiation impinging through insulating region (24) on said n-well (21) through and on said junction region (23) are collected in said contact area and can be used to create an electrical response or output signal.

The detector as shown in FIG. 2 advantageously exploits the fact that the photons of different wavelengths of the impinging light create charge carriers at different depths in the detection junction. The junction depth, or depth of the well (21) can be adapted to collect substantially all of these charge carriers. Typically the depth of a well-region (21) is about 0.7–1.0 $\mu$m in a 0.18 $\mu$m CMOS process whereas the efficient depth of the p-n junctions in a planar detection geometry is only about 0.1 $\mu$m. As a result the $\eta_{coll}$ factor is drastically improved. Also, as the detection junction is under an insulating region (24), the regions (28) and (29) can be processed without the need for introducing a mask that avoids silicidation whereby the process of manufacturing the detector can be executed without major deviations of standard processing.

Figure 3:
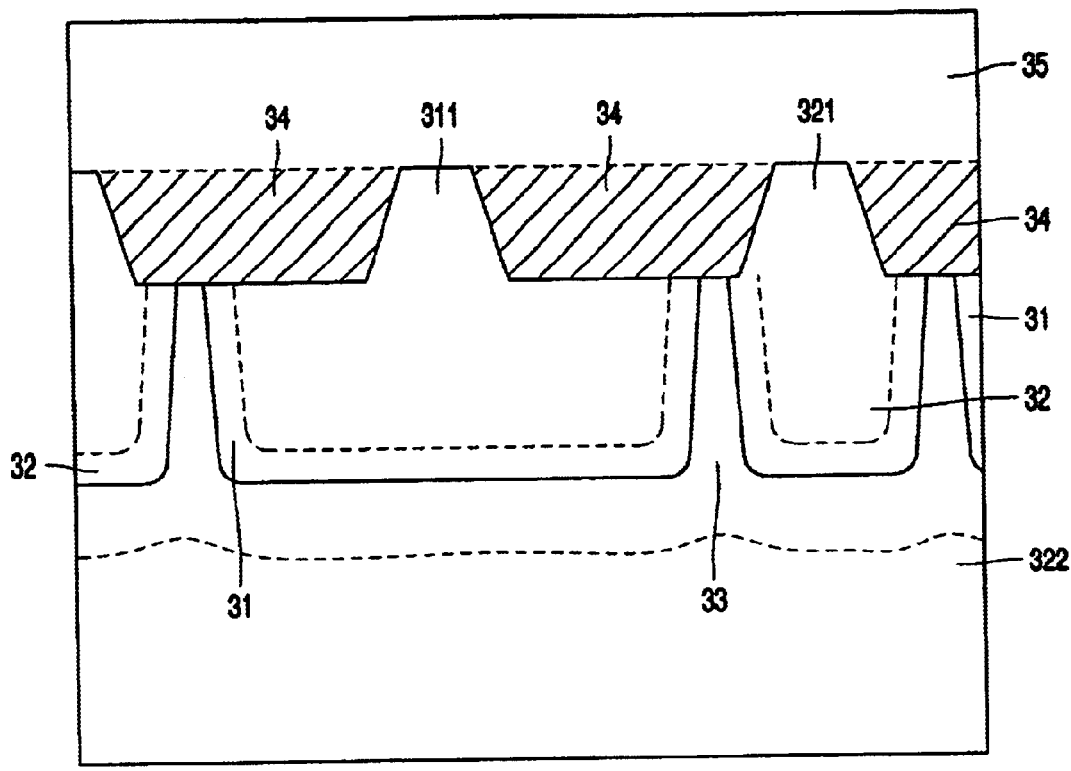
FIG. 3 schematically shows in cross section an alternate embodiment of a vision sensor of the invention. Shown is a repetition of alternating n-well (31, 411-419) and p-well regions (32, 42) in a p⁻-type silicon substrate that build up a matrix of pixels of an imaging sensor.
Figure 4:
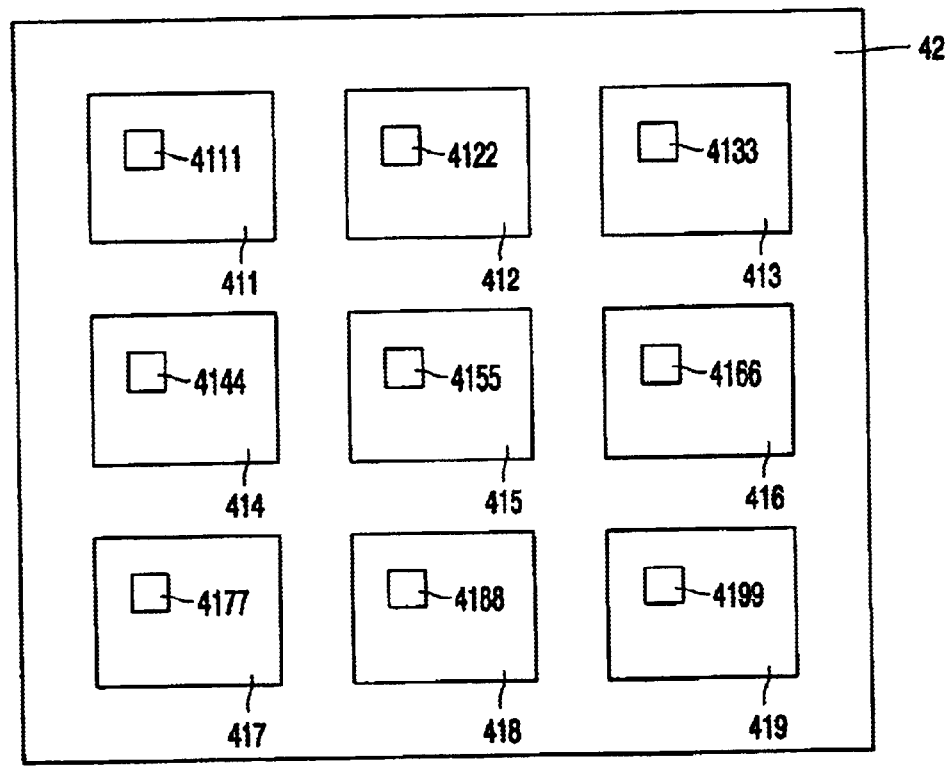
FIG. 4 shows a top view image of the sensor of the invention depicted in FIG. 3. A 3×3 matrix of pixels is shown.

Different configurations of the detector shown in FIG. 2 can be imagined. FIG. 3 and 4 show how the repetition of alternating n-well (31, 411-419) and p-well regions (32, 42) in the $p^-$-type silicon substrate can build up a matrix of pixels that build up an imaging sensor, which can be part of a camera system. A 3×3 matrix of pixels is shown. Each n-well region (31, 411-419) can form with the surrounding p-type regions a pixel of the matrix of pixels. In the elevated portions 321, (311, 4111-99) the regular oxide and silicide processing can be done. As a result, in the elevated portions (311, 4111-99) of the n-well regions (311, 4111-99) a contact area can be defined according to techniques known to the person of skill in the art. In the elevated portions of the p-type material (321) the associated amplifying and/or access transistors of the pixel can be defined according to techniques known to the person of skill in the art. These transistors can also be defined within the elevated portions of the n-well regions. In these elevated portions of the p-type and n-type regions, the contact area's and transistors can be defined according to standard process steps known to the person of skill in the art. In these area's silicided regions may be defined as the presence of silicides in these regions is not detrimental to the conversion efficiency of the imaging sensor. The area above the p-n junction and above the n-well region is covered with a transparent insulator (oxide) material. An intermetal dielectric layer (35, 45) is overlying the elevated portions of the silicon substrate (311) and also the insulator region (34). Other metallization layers and via and contact holes can be present above and in the intermetal dielectric layer. Metal lines may be made around the insulator region (34) or may be locally thinned above the insulator region (34). The contact area in the n-well region can be connected to the transistors into elevated portions of the p-type material via the metalization layer. In this way, a pixel is defined. If the p-well region is biased to ground and an appropriate voltage (2–5 Volt) is defined on the contact area within the $n^+$-area, the charge carriers that are generated by the radiation impinging on the n-well (31) through insulating region (34) and on the junction region (33) are collected in said contact area and can be used to create an electrical response or output signal (see also FIG. 5). As the p-regions are surrounding the n-well regions, it is advantageous that the p-region is biased to ground. However other voltages may be enforced on the n- and p-regions in order to ensure efficient collection of the charge carriers that are created by the impinging radiation. Also it is not necessary that n- and p-type regions are defined as a well, it is sufficient that regions of n-type and p-type conductivity are present. The positions and roles of the n-type and p-type regions can be interchanged, a substrate with another doping type can be chosen, and the regions can have different geometry's than those shown in the figures. Also the elevated portions shown in FIGS. 3 and 4 can be just flat regions of silicon substrate, wherein the contact area's and transistors are defined. The substrate can be any kind of solid state material such as silicon, silicon-on-insulator material, GaAs, or a polymer. The photosensitive part of the imaging sensor being covered with a transparent material, that can be made of an insulator or semiconducting material such as an insulating polymer, or an oxide or a nitride or a carbide material or any combination thereof.

The presence of the transparent insulator or semiconducting material is not mandatory but is beneficial for decreasing the presence of dangling bonds and interface states and charges in the surface area of the photosensitive elements. A low doping level of the substrate and/or of the n-type and p-type (well-)regions furthermore is beneficial for achieving a low density of interface states at the silicon surface. As explained above, the low doping level is also beneficial in order to obtain a high efficiency in the conversion of the impinging radiation.

Upon or in the metallization layer or directly on the insulator region (34), there may further be positioned microlenses to focus the incoming light on the photosensitive elements (thus on the n-well region (31) and the junction region(33)) and there may further be positioned color filters or IR-light or UV-light filters. Techniques to make such microlenses and light-sensitive filters are known in the art. Techniques of making microlenses are disclosed e.g. in the patents U.S. Pat. Nos. 5,871,898 and 6,001,540 and 5,796,154 the teaching thereof being incorporated herein by reference.

Advantageously, as shown in FIG. 3, the n-well regions (31) can be made larger than the p-well regions (32) which increases the $\eta_{geom}$ factor. Also as shown in FIG. 3, it is advantageous that the n-well region and the p-well region are adjacent but not touching and still separate one from another. In this geometry a $n-p^-$-p diode is made which again results in an increased $\eta_{coll}$ factor.

Typical dimensions of the structures shown in FIG. 3 and in FIG. 4 in a 0.18 $\mu$m CMOS technology are as follows. The height of the elevated portions (311) is about 0.3 $\mu$m; the depth of the well regions is about 0.7–1.0 $\mu$m. The size of the n-well regions (411-9) as shown in FIG. 4 can be about 2×2 $\mu$m or 4×4 $\mu$m or larger. The p-well region should contain at least an amplifying transistor in case an active pixel sensor is to be made and thereto the p-well region in-between two n-well area's may be as large as about 0.09–1.2 $\mu m^2$ in the 0.18 $\mu m$ CMOS technology. Typical doping levels of the different regions are of the order of $10^{15}$–$10^{17}$/cm$^3$. The doping levels may also be lower, of the order of $5.10^4$/cm$^3$, or higher, of the order of $5.10^{17}$–$10^{18}$/cm$^3$. Thus according to this embodiment of the invention, use can be made of a first region of n-type conductivity, preferably of a doping level of charge carriers of the order of $10^{15}$–$10^{17}$/cm$^3$, and of a second region of p-type conductivity, preferably of a doping level of charge carriers of the order of $10^{15}$–$10^{17}$/cm$^3$ for making a detector for light. The first region according to this embodiment can be a n-well in the silicon substrate. The second region can be part of the substrate or can be an additional p-well in the substrate. The first and the second region according to this embodiment can have a depth of about 0.3 to 0.5 to 1 $\mu m$. Only the first region can have this depth, the second region being part of the substrate or having the same doping type but a different doping level than the substrate. The first region and the second region can be made by ion implantation or by diffusion of n-type, resp. p-type dopants, in the p$^-$-substrate or in another well in the substrate that was made in a foregoing manufacturing step.

Figure 5A:
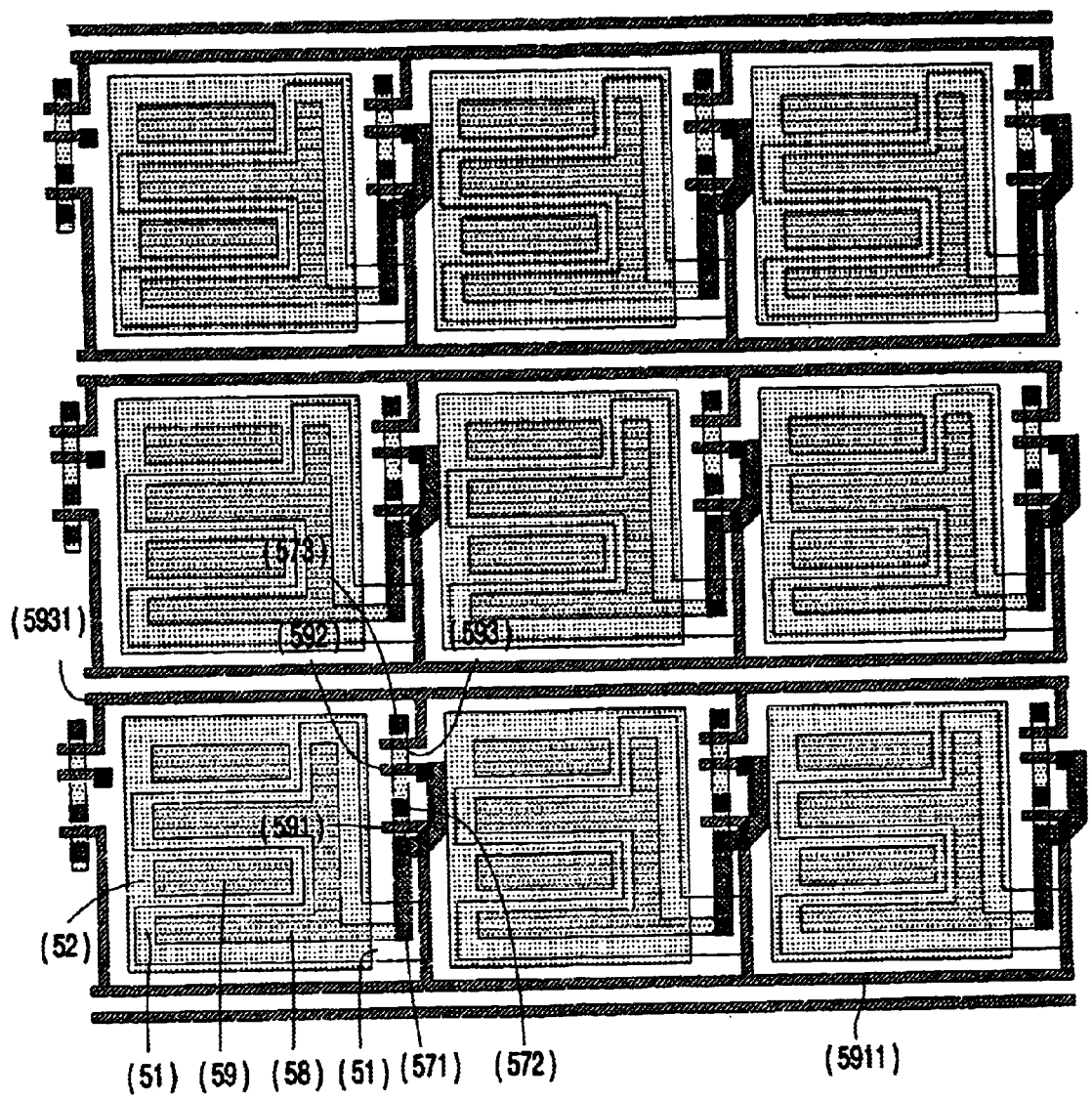
FIG. 5a: shows a design layout of a sensor according to a best mode embodiment of the invention; the schematic pixel configuration is shown in FIG. 5b.
Figure 5B:
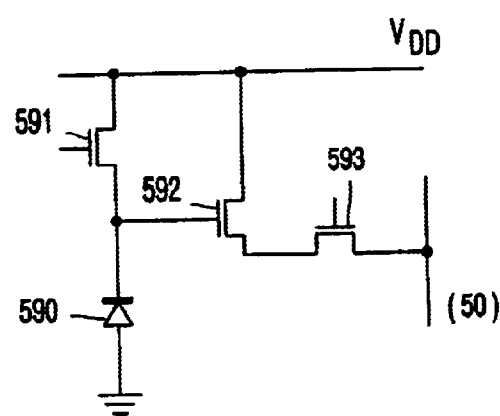

FIG. 5a shows a design layout (top view) of an imaging sensor (3×3 pixel matrix) that is part of a camera system according to a best mode embodiment of the invention; the schematic pixel configuration is shown in FIG. 5b. As stated above, FIG. 5a is designed according to the design rules of a 0.18 $\mu m$ CMOS process. Shown in FIG. 5a is the n-well region (51) that is as a meander-like region interdigitated in the p-type substrate (52). There is a n$^+$-type (58) and a p$^+$-type (59) region in the n-type, resp. p-type regions. There is a contact (area) (571) in the n-well region (51) for contacting circuit elements of the pixel with the n-well region. The different circuit elements of the 3T-transistor pixel shown in FIG. 5b can be seen in FIG. 5a. The $V_{dd}$ supply voltage is connected to each pixel via contact (572). The gate of the select transistor (593) and of the gate of the amplifying transistor (592) are shown in FIG. 5a. The select transistors of each pixel are connected to a select line (5931). The gates of the reset transistors (591) of the different pixels are connected to a reset poly (5911). The contact (573) is connected to the column bus (50) that is taking the output signals of all pixels of one column. The photosensitive element (590) of FIG. 5b is formed by the n-well region and the depletion region of the detection junction between the n-well region and p-type substrate. The p-type substrate is grounded (not shown in the FIG. 5a). Typical values for the $V_{dd}$ supply voltage in a 0.18 $\mu m$ CMOS process are below 3 Volt, of the order of 1,8 to 2,5 Volt. Typical voltages on the reset transistor are of the order of 0–3 Volt.

FIG. 6 shows a process flow for the manufacturing of a detector of the invention, according to a best mode embodiment of the manufacturing process. A method is disclosed for fabricating a camera system for electromagnetic radiation, said camera system comprising a configuration of pixels in an imaging sensor being integrated in a solid state substrate of a second conductivity type. The method comprises a number of steps including: the definition of a region of a first conductivity type in said substrate; the definition of a region of a second conductivity type, adjacent to said region of said first conductivity type in said substrate, thereby forming a junction region ; etching at least part of the substrate of the region of the first conductivity type to thereby form a trench in said substrate; filling the etched trench with an insulator material and providing means for contacting the region of the first conductivity type and for collecting charge carriers being generated by the radiation impinging on said substrate at least in said region of said first conductivity type and in said junction region, in said means for contacting the region of the first conductivity type.

A best mode process of executing the manufacturing process of the invention is described in the sequel. The process is part of a CMOS 0.18 $\mu m$ CMOS process with a Shallow-Trench-Isolation (STI) option.

Figure 6A:
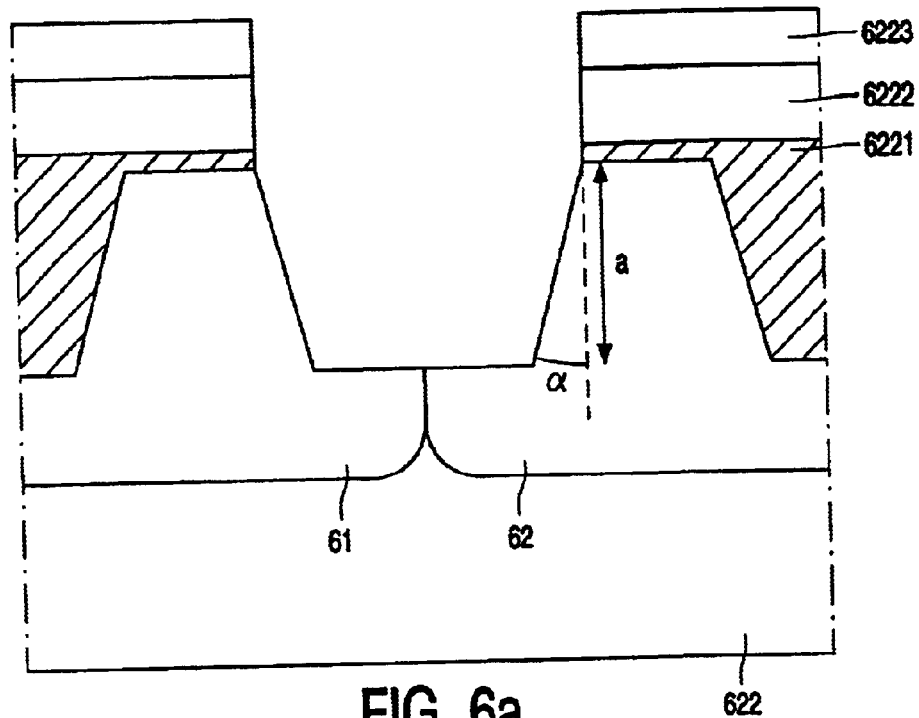
FIG. 6 shows a sequence of process steps according to the best mode embodiment of the manufacturing process of a sensor of the invention.

In a first step of executing the best mode process of the invention, in a silicon solid state substrate (622), a silicon wafer of a p$^-$-type doping level, alternating n-well (61) and p-well (62) regions are defined by diffusion of arsenic and boron dopants. In an alternate embodiment, these regions may be defined by implantation. On the silicon wafer, a 2–20 nm thick layer of silicon oxide (6221) is defined, whereon a layer of a thickness of about 150 nm of Si$_3$N$_4$ (6222) is deposited. On this stack a photomask layer (6223) is made (FIG. 6a). The photomask layer may also be a hard mask layer in an alternate embodiment. With the techniques of photolithography, a pattern is defined in the photomask layer. The resulting structure is then etched in an APPLIED MATERIALS 5000 rf plasma etcher operating at a power of about 300 Watt. The depth 'a' is about 250–400 nm. The angle a typically is about 80–87°. Etching equipment of other manufacturers, known to the person of skill in the art, may also be used. The etching step may also be executed with a wet etching procedure.

In a second step of executing the process of the invention, the photomask layer (6223) is taken away; for example by etching in an oxygen-plasma or by a wet etch with a chemical solution. This process step is common in the art.

Figure 6B:
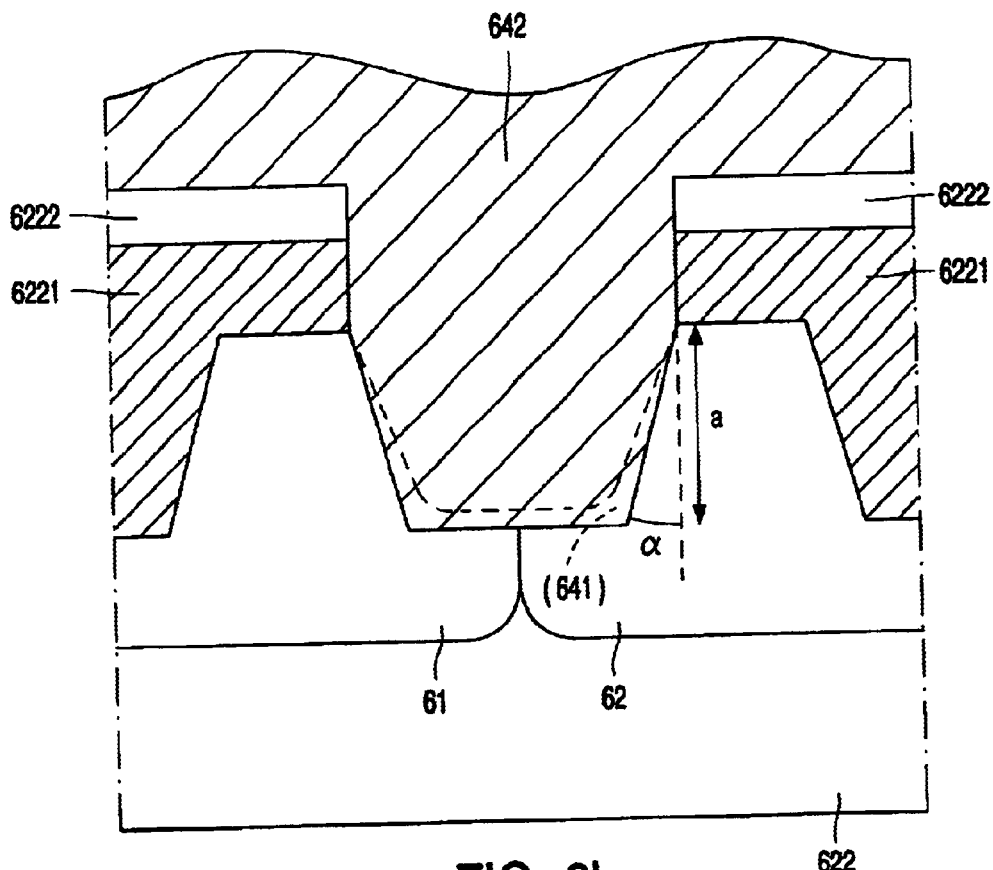
Figure 6C:
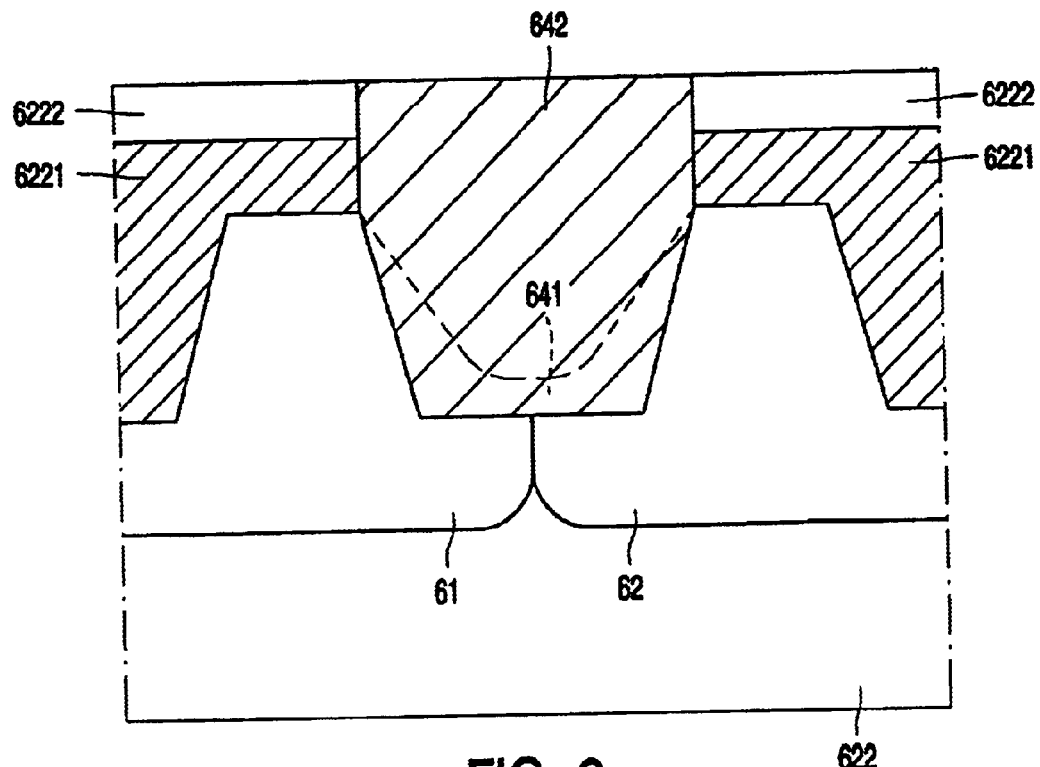
Figure 6D:
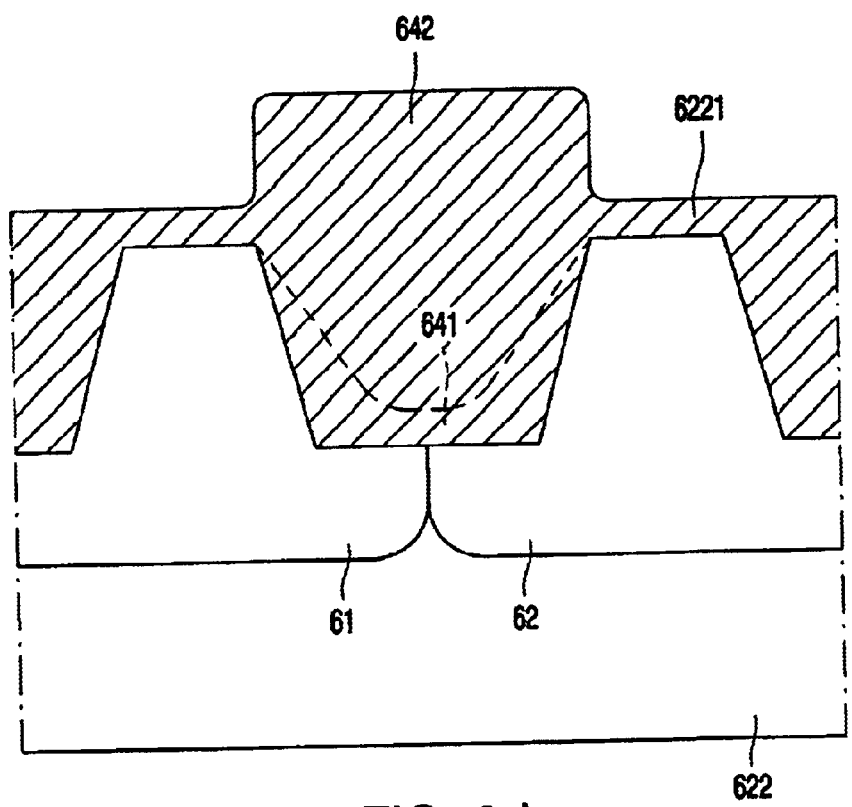

A thin silicon-oxide (641) thereafter is grown in the trench that is present in the silicon substrate (FIG. 6b). The oxide can have a thickness of about 20–25 nm and can be grown in a H$_2$O/O$_2$ environment at a temperature of about 1200–1250° C. in a classical oxidation furnace such as commercialized by the companies TEL or ASM. This step of growing a thin oxide layer can optionally be foregone by a step of growing a sacrificial oxide whereafter an HF-based etch (for example HF: H$_2$O in a 1:100 ratio) of the sacrificial oxide can be executed. The step of growing the thin oxide layer of 20–25 nm is beneficial in reducing the dangling bonds and the plasma damage at the silicon surface. Typically the oxidation furnace during the growth of the thin oxide layer (641) is quickly ramping up to the temperature (1200–1250° C.) needed during this ramp up a low oxygen concentration is present in the environment in the furnace. Thereafter a steady state regime with a constant temperature (1200–1250° C.) in the presence of a H$_2$O/O$_2$ environment is installed. At the end of the heating cycle a N$_2$ or He or another non-reactive environment is fed into the furnace. It is also possible to introduce Chlorine or Chlorine-containing molecules such as DCE or oxalylchloride in the furnace during the heating cycle. After this step of growing a thin oxide layer (641), a thick silicon-oxide (642) is deposited on the wafer. In order to avoid the problem of the difference in aspect ratio of the different structures present on the silicon wafer, the thick silicon-oxide is grown in a SACVD (Chemical Vapour Deposition) or a HDP (High Density Plasma) system.

In a next step, the surface of the wafer is flattened by Chemical-Mechanical Polishing (CMP). Thereafter the nitride layer (6222) is removed (see FIGS. 6c and 6d). The nitride layer can be removed using a dry etching system, or using a wet etching system with H$_3$PO$_4$ and/or H$_2$SO$_4$ as etchants. In or on the oxide regions (6221), transistors can be defined. Upon the oxides a stack of metallization layers and intermetal dielectrica can be defined.

At the end of the process the final structures on the silicon wafer can be heated in a $N_2/H_2$ (90:10) environment for a period of about 30–60 minutes. The presence of $H_2$ molecules that can convert to H can contribute to a further passivation of dangling bonds.

What is claimed is:

1. A camera system for electromagnetic radiation, said camera system comprising a configuration of pixels in an imaging sensor being integrated in a solid state substrate, essentially each of the pixels comprising:

a region of a first conductivity type being at least partly surrounded by a region of a second conductivity type, thereby forming a region of a detection junction; and at least part of the detection junction being substantially orthogonal to a plane of a surface of the substrate, wherein the part of the junction has a depletion region having a depth in a direction substantially orthogonal to the plane and a width in a direction substantially parallel to the plane, and the depth is greater than the width.

2. The camera system as recited in claim 1 further comprising at least one operation transistor being integrated in an area portion on the region of said second conductivity type.

3. The camera system as recited in claim 1 wherein the region of the first conductivity type includes at least one contact area, and wherein said camera system comprises means for collecting charge carriers being generated by the radiation impinging on said substrate at least in said region of said first conductivity type and in said region of said detection junction, in said contact area.

4. The camera system as recited in claim 1 wherein the region of the second conductivity type is surrounding the region of the first conductivity type along its sides.

5. The camera system as recited in claim 1, wherein the region of the second conductivity type is shared among at least two adjacent pixels and wherein said region of said second conductivity type is grounded.

6. The camera system as recited in claim 1 wherein said first region is at least partly covered by a passivating layer, said passivating layer optionally defining a smooth interface with the first region.

7. The camera system as recited in claim 6 wherein the contact area is on an elevated part of the substrate, said elevated part interrupting said layer containing the passivating layer.

8. The camera system as recited in claim 1 further comprising a microlens system for directing the radiation impinging on said imaging sensor into said region of said first conductivity type and in said junction region, and comprising a filter being sensitive for a characteristic of the impinging radiation.

9. The camera system as recited in claim 1 wherein said sensor is integrated in a silicon substrate according to a 0.18 $\mu$m or a smaller gate length CMOS process including a STI-option.

10. A method of operating a camera system for electromagnetic radiation, said camera system comprising: a configuration of pixels in an imaging sensor being integrated in a solid state substrate, essentially each of the pixels comprising a region of a first conductivity type being at least partly surrounded by a region of a second conductivity type, thereby forming a junction region at least a part of which is substantially orthogonal to a plane of a surface of the substrate, wherein the part of the junction region has a depletion region having a depth in a direction substantially orthogonal to the plane and a width in a direction substantially parallel to the plane, and the depth is greater than the width, and wherein the region of the first conductivity type includes at least one contact area; and the method comprising the step of configuring the region of the first conductivity type and the region of the second conductivity type as to collect charge carriers being generated by the radiation impinging on said substrate at least in said region of said first conductivity type and in said junction region, In said contact area.

* * * * *